(12) United States Patent
Shaver et al.

(10) Patent No.: US 8,324,554 B2
(45) Date of Patent: Dec. 4, 2012

(54) SINGLE-ELECTRON DETECTION METHOD AND APPARATUS FOR SOLID-STATE INTENSITY IMAGE SENSORS WITH A CHARGE-METERING DEVICE

(75) Inventors: David C. Shaver, Carlisle, MA (US);
Bernard B. Kosicki, Acton, MA (US);
Robert K. Reich, Tyngsboro, MA (US);
Dennis D Rathman, Ashland, MA (US);
Daniel R. Schuette, Arlington, MA (US); Brian F. Aull, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 437 days.

(21) Appl. No.: 12/730,037

(22) Filed: Mar. 23, 2010

(65) Prior Publication Data

US 2011/0233386 A1    Sep. 29, 2011

(51) Int. Cl.
*H01L 31/00* (2006.01)
(52) U.S. Cl. .................. 250/214 R; 250/214.1; 257/431
(58) Field of Classification Search ............... 250/208.1, 250/208.2, 214.1, 214 R; 257/431
See application file for complete search history.

(56) References Cited

U.S. PATENT DOCUMENTS

| | | | | |
|---|---|---|---|---|
| 7,714,292 B2 * | 5/2010 | Agarwal et al. | .......... | 250/370.01 |
| 7,858,917 B2 * | 12/2010 | Stern et al. | ................ | 250/214 R |
| 2004/0022538 A1 | 2/2004 | Shushakov et al. | | |
| 2004/0106265 A1 * | 6/2004 | Vickers | .......................... | 438/380 |
| 2010/0019295 A1 * | 1/2010 | Henderson et al. | ........... | 257/292 |

OTHER PUBLICATIONS

Holl, Peter, et al., "A New High-Speed, Single Photon Imaging CCD for the Optical", Nuclear Science Symposium Conference Record, 2006. IEEE, Piscataway, NJ, USA, Piscataway, NJ, USA, Oct. 1, 2006.
Lutz, G., et al, "Development of avalanche-drift and avalanche-pixel detectors for single photon detection and imaging in the optical regime", Nuclear Instruments & Methods in Physics Research. Section A: Accelerators, Spectrometers, Detectors, and Associated Equipment, Elsevier BV, North Holland, Netherlands, vol. 567, No. 1, Nov. 1, 2006, pp. 129-132.
Written Opinion of the International Searching Authority mailed Apr. 20, 2012 for PCT/US2011/026814.
International Search Report mailed Apr. 20, 2012 of PCT/US2011/026814.

* cited by examiner

*Primary Examiner* — Francis M Legasse, Jr.
(74) *Attorney, Agent, or Firm* — Foley & Lardner LLP

(57) ABSTRACT

Embodiments of the present invention include an electron counter with a charge-coupled device (CCD) register configured to transfer electrons to a Geiger-mode avalanche diode (GM-AD) array operably coupled to the output of the CCD register. At high charge levels, a nondestructive amplifier senses the charge at the CCD register output to provide an analog indication of the charge. At low charge levels, noiseless charge splitters or meters divide the charge into single-electron packets, each of which is detected by a GM-AD that provides a digital output indicating whether an electron is present. Example electron counters are particularly well suited for counting photoelectrons generated by large-format, high-speed imaging arrays because they operate with high dynamic range and high sensitivity. As a result, they can be used to image scenes over a wide range of light levels.

15 Claims, 11 Drawing Sheets

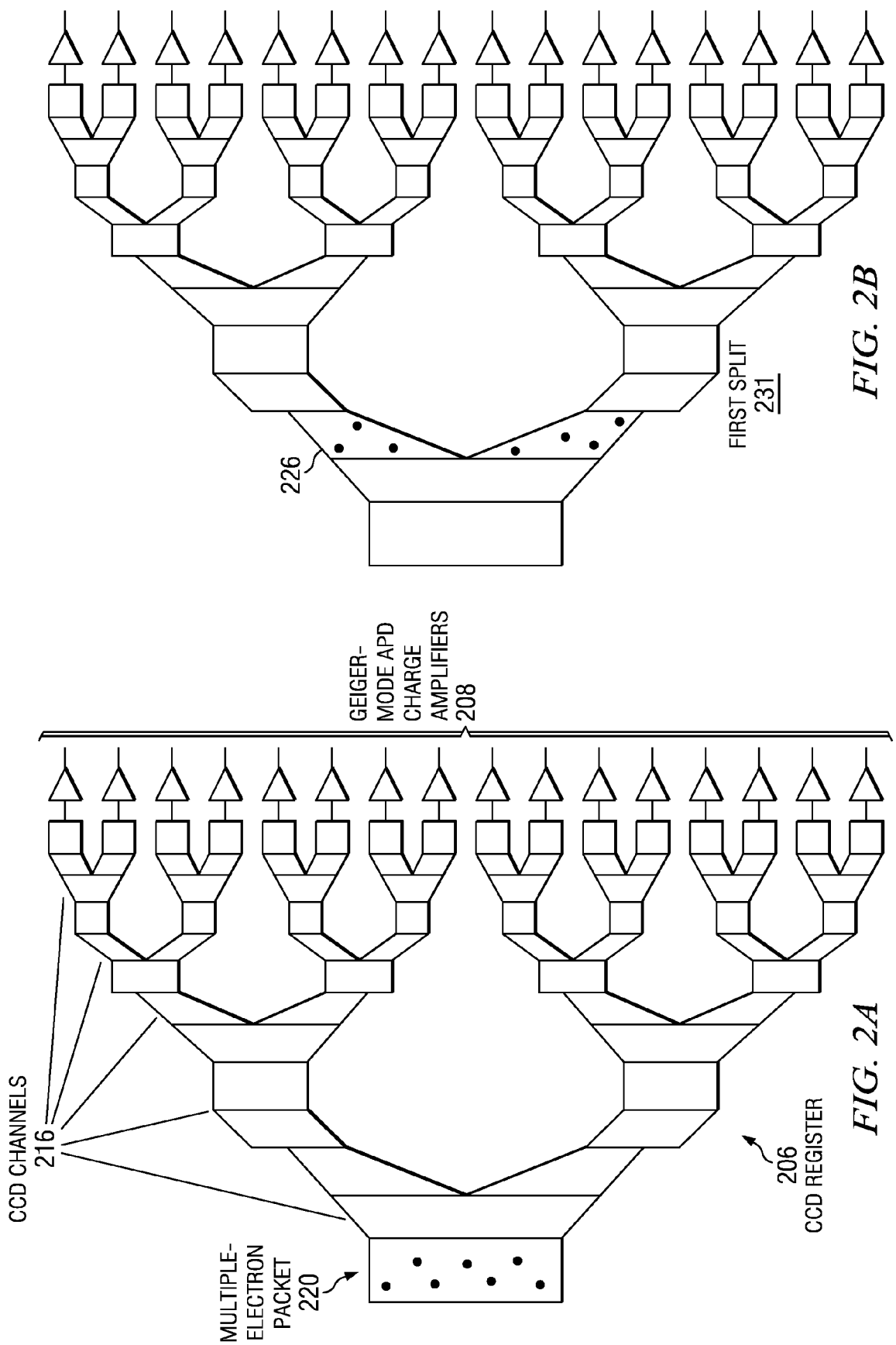

SINGLE-ELECTRON DETECTION METHOD AND APPARATUS FOR SOLID-STATE INTENSITY IMAGE SENSORS WITH A CHARGE-METERING DEVICE

GOVERNMENT SUPPORT

The invention was supported, in whole or in part, by grant FA8721-05-C-0002 from the Department of Defense and the Defense Advanced Research Projects Agency. The Government has certain rights in the invention.

BACKGROUND OF THE INVENTION

Many imaging applications require very sensitive light detection and wide dynamic range. An example is urban imaging where the light intensity can vary over several orders of magnitude (e.g., dark alleys to street lights). To achieve the best sensitivity, single photoelectron detection is needed, but often dynamic range is sacrificed. Several devices are available for detecting single photons (photoelectrons), such as photomultiplier tubes, intensified solid-state imagers, avalanche-register charge-coupled device (CCD) imagers, and Geiger-mode avalanche photodiodes. Each of these approaches has advantages for specific low-light-level imaging applications, but is limited in dynamic range.

SUMMARY OF THE INVENTION

Embodiments of the present invention include an electron counter suitable for use with an imaging array and a corresponding method of counting electrons, including the photoelectrons generated by an imaging array. Example electron counters include a charge-coupled device (CCD) register configured to transfer electrons and a Geiger-mode avalanche diode operably coupled to an output of the CCD register. Electrons are delivered from the output of the CCD register to the Geiger-mode avalanche diode, which provides a digital output that indicates the presence or absence of an electron with the Geiger-mode avalanche diode. Some electron counters also include noiseless charge splitters configured to split and deliver packets of electrons from the CCD register to each of several Geiger-mode avalanche diodes. Further electron counters also include a nondestructive readout amplifier operably coupled to the output of the CCD register. The nondestructive readout amplifier senses the charge at the output of the CCD register and provides an analog output whose amplitude represents the amount of the charge sensed.

Embodiments of the present invention also include a method of making electron counters. First, an $n^+$-doped region is formed in a substrate. Next, a $p^+$-doped barrier layer is formed adjacent to the $n^+$-doped region in the substrate to create a Geiger-mode avalanche diode. Then a buried channel of a CCD is formed adjacent to the $p^+$-doped barrier layer in the substrate to form the electron counter.

The electron counters described herein are particularly well suited for counting photoelectrons generated by large-format, high-speed, intensity imaging of scenes with signal levels varying from a single photoelectron to hundreds of thousands of photoelectrons. Compared to other photoelectron counting devices, the electron counters described herein operate with higher dynamic range and sensitivity because they combine the advantages of CCD performance at high light levels with the sensitivity of digital electron counting at low light levels. At low light levels, example electron counters split or meter charge packets into single-electron packets, each of which is detected by a Geiger-more avalanche diode. Because splitting/metering occurs in the charge domain, it is nearly noiseless, so the counter is immune to the readout noise that plagues analog readout circuits. At higher light levels, when charge swamps the splitter/meter and avalanche diodes, a separate nondestructive amplifier extends the dynamic range by providing an analog readout whose amplitude depends on the charge collected by the CCD register. Thus, the inventive electron counters operate with high sensitivity and high dynamic range.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 2A-2E are block diagrams that illustrate charge splitting and detection using an electron counter with a sixteen-channel, charge-splitting CCD register.

DETAILED DESCRIPTION OF THE INVENTION

Figure 1:
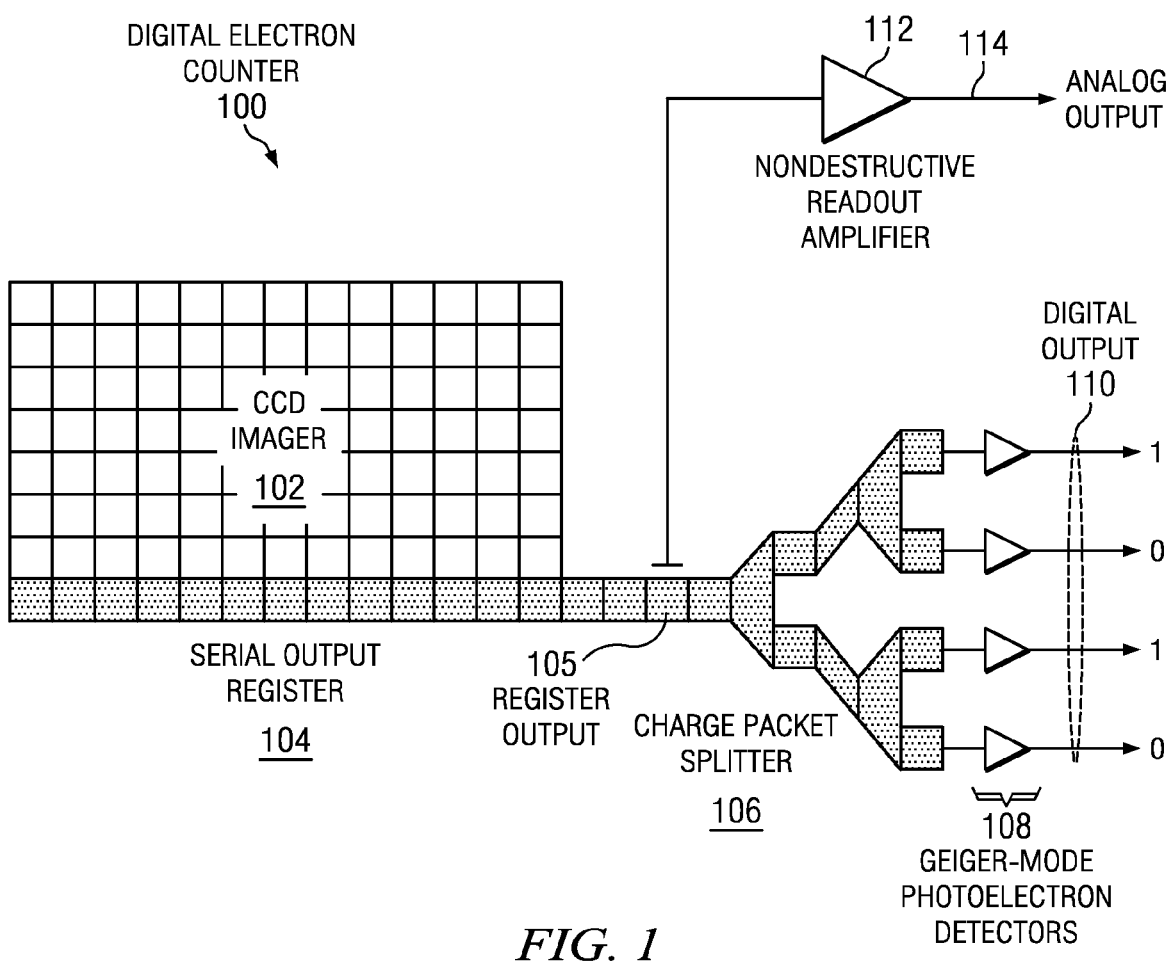
FIG. 1 is a block diagram of an electron counter coupled to a charge-coupled device (CCD) imager.

FIG. 1 is a block diagram of an electron counter 100 coupled to a CCD imager 102. The CCD imager 102 converts incident photons into photoelectrons whose spatial distribution follows the irradiance of the incident light. Each sensing element in the CCD imager 102 accumulates photoelectrons to form packets of charge that are transferred serially along the columns of the array to a serial output register 104 in the electron counter 100.

The serial output register 104, also known as a CCD register 104, transfers charge to a register output 105. A nondestructive readout amplifier 112 coupled to the register output 105 senses the transferred charge packet and generates an analog voltage 114 whose amplitude corresponds to the size of the charge packet. Generally, large charge packets produce voltages 114 whose amplitudes are well above the analog noise floor. If the charge packet is too small, however, then the amplitude of the analog voltage 114 may not be high enough above the noise floor to guarantee detection.

Fortunately, the electron counter 100 can detect small charge packets nearly noiselessly with a charge packet splitter 106 and an array of Geiger-mode avalanche diodes (GM-ADs) 108. The splitter 106, which is coupled to the output 105, separates small charge packets into even smaller charge packets of one electron each. The splitter 106 couples each of these single-electron packets to a corresponding GM-AD 108. When the electron enters the high-field region of the GM-AD 108, the electron triggers an avalanche event at the GM-AD 108 that produces a relatively large voltage change (e.g., about 1 V) at the GM-AD's output 110. Because this voltage change is so large, it is easily distinguished from background noise and can be treated as a digital signal, shown in FIG. 1 as ones and zeros, and the output 110 can be treated as a digital output 110. Summing the ones from the GM-ADs 108 yields the total number of electrons in the originating charge signal. Because there are no noise processes associated with splitting or with avalanche detection, except for multiple-electron detections (i.e., when more than one electron arrives at a single GM-AD 108), the detection process is essentially noiseless.

The number of GM-ADs 108 is chosen so that the number of electrons that the electron counter 100 can detect is greater than the sensitivity (equivalent-electron noise performance) of the analog nondestructive charge-sensing amplifier 112. In other words, the analog and digital detection regimes overlap; the largest signal that the GM-ADs 108 can detect is larger than the smallest signal that the nondestructive amplifier 112 can detect. Therefore, the noise performance of the counter 100 ranges from single-electron detection up to the total capacity of each CCD well in the serial output register 102.

In some cases, the outputs from the nondestructive readout amplifier 112 and the GM-ADs 108 can be used to produce a more precise measurement of the number of detected photons. For example, the low end of the amplifier's operating range may overlap with the high end of the operating range of the GM-ADs 108. To produce a more precise measurement, the amplifier 112 makes a nondestructive reading of the charge packet before the charge packet is split and conveyed to the GM-ADs 108. Averaging the output 110 from the GM-ADs 108 with the analog voltage 114 from the amplifier 112 may reduce the noise by a factor of up to 12. Alternatively, the signals can be combined by performing a weighted average using weights that depend on where the signal strength falls within the overlap of the operating ranges of the amplifier 112 and the GM-ADs 108. As the signal strength increases, the weight corresponding to the amplifier 112 may increase and the weight corresponding to the GM-ADs 108 may decrease; similarly, as the signal strength decreases, the amplifier weight decreases and the GM-AD weight increases.

Although the counter 100 shown in FIG. 1 counts electrons, similar devices may be constructed to count holes instead. For devices made of silicon, counting electrons is preferred to counting holes because the electron mobility of silicon is higher than the hole mobility of silicon. Those skilled in the art will understand, however, that the present inventive devices and techniques apply to counting charge, generally, and electrons and holes, specifically.

Charge-Splitting CCD Register

Figure 2D:
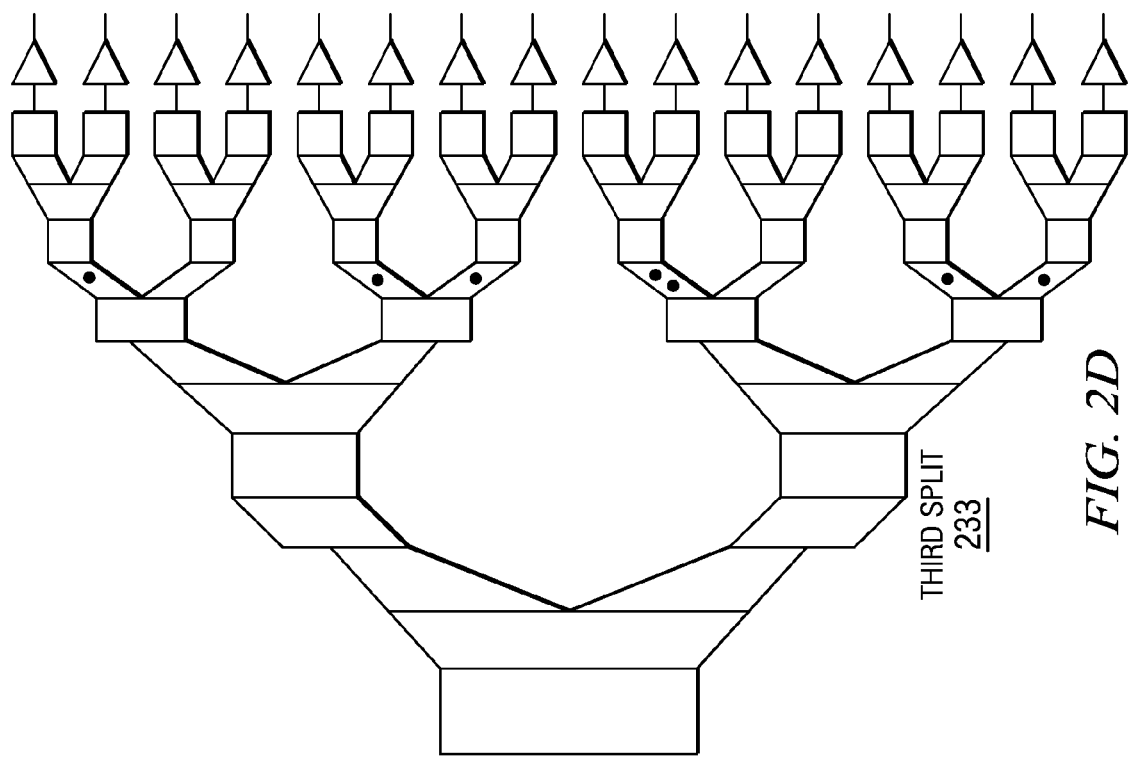
Figure 2C:
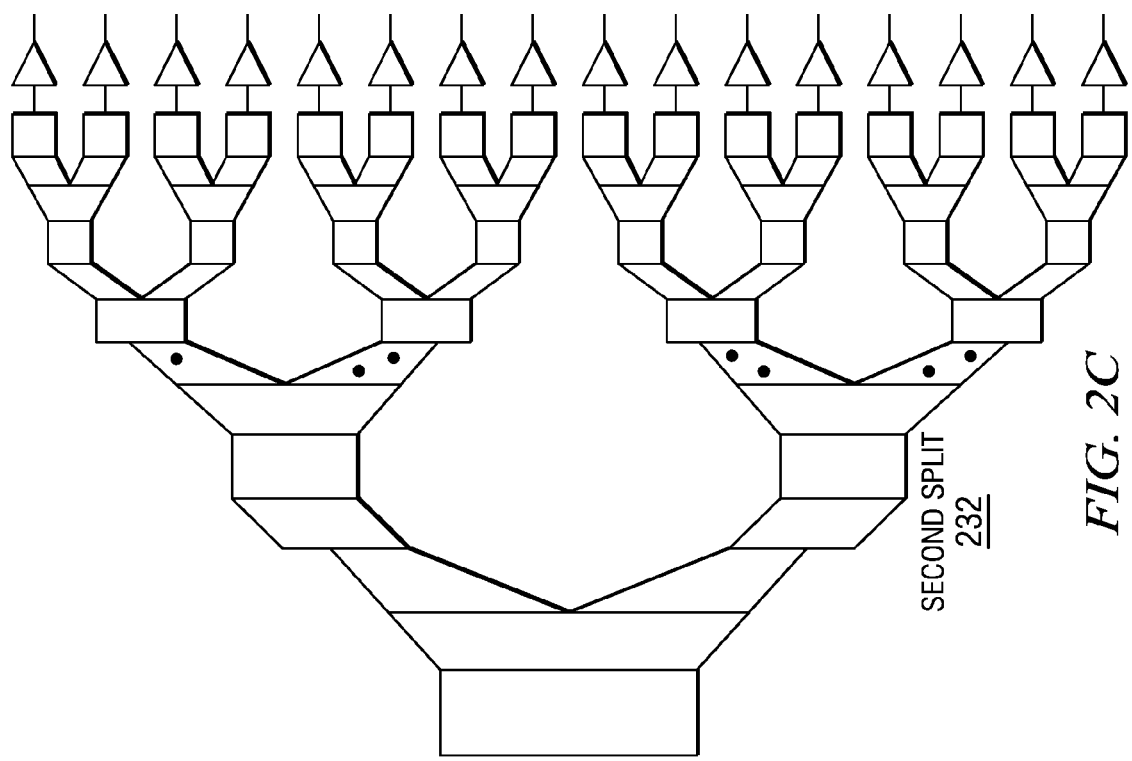
Figure 2E:
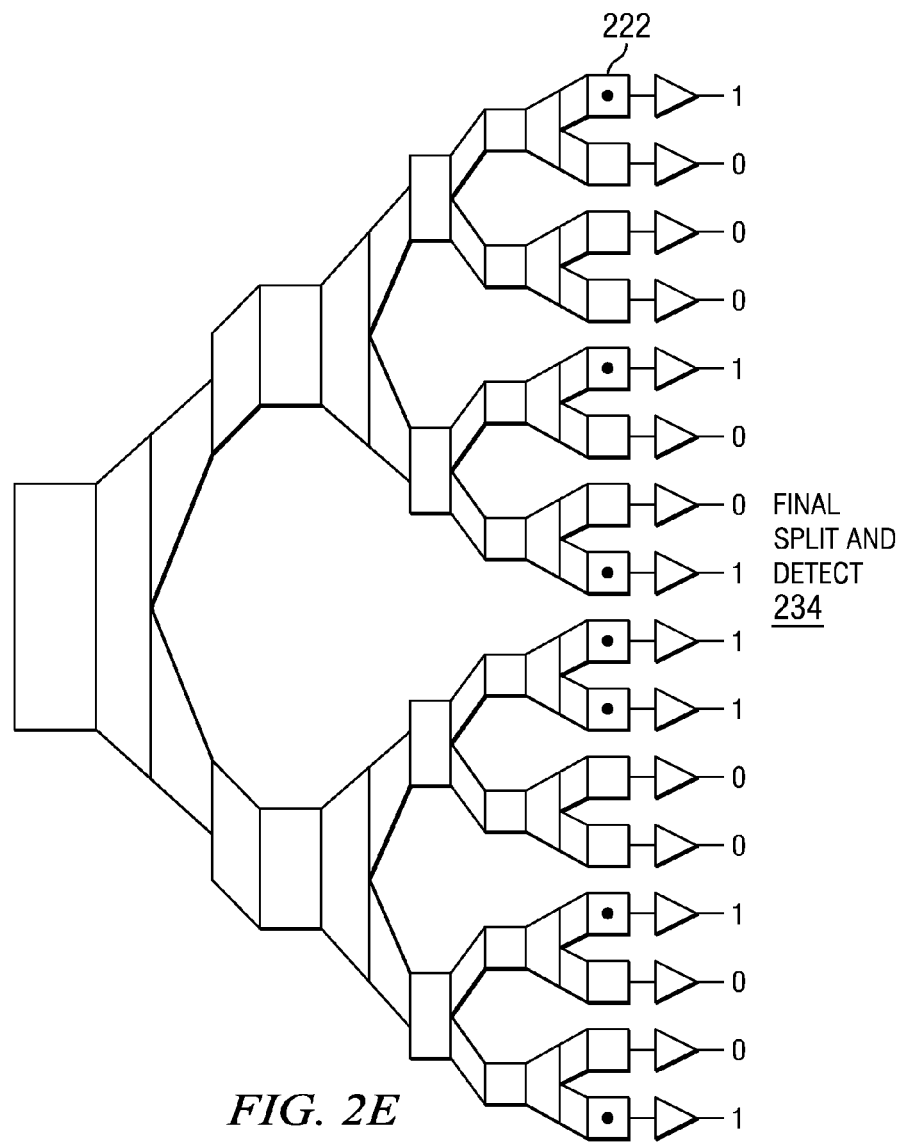

FIGS. 2A-2E show the splitting of a multiple-electron charge packet 220 with a tree-like CCD register 206. The CCD register 206 divides the multiple-electron packet 220 into single-electron packets 222 using binary charge splitting, where the charge is split in half four times per path. As the packet 220 propagates through the CCD register 206, it splits in half every time it encounters a fork 226 in the CCD register 206. At the first split 231, the packet 220 is divided into two smaller packets, which propagate through parallel registers (CCD channels) 216. As shown in FIG. 2B, the register 206 splits packets in half, on the average. The smaller packets are split two more times (232, 233) into parallel registers 216 until there is confidence that each element in the register 206 contains no more than a single electron. An array of GM-ADs 208 coupled to the output of the register 206 detects the single-electron packets 222 to produce digital signals (ones and zeros) as described above.

The main source of error in the splitting and detection is the simultaneous arrival of multiple electrons at a single GM-AD, which causes the register to produce a count that is lower than the actual number of electrons present. Undercounting can be prevented by choosing the number of splits per path to keep the probability of multiple electrons reaching the same GM-AD simultaneously below an acceptable level. Generally, the probability that multiple electrons will reach the same GM-AD simultaneously can be determined using standard statistical techniques and may depend on device temperature, potential barrier height, and other parameters.

To make splitting more efficient, input charge packets may be split into three or more pieces at each junction to reduce the number of splitting events. An alternative technique for splitting the charge into single electron packets is to let the charge equally distribute over a CCD register composed of several register elements. In this alternative technique, lowering the potential barriers between the wells in the CCD register allows the charge in the wells to diffuse throughout the entire CCD register. Raising the potential barriers after the charge has diffused evenly traps packets of charge in each well, where each packet is, on average, equal to every other packet.

Charge Metering

The separation of a charge signal into single electron packets can also be done by "fill and spill" techniques, also known as charge metering. This fill and spill technique has been used previously in analog signal processing CCD devices to create charge packets of arbitrary but controlled sizes. For more information, see Carlos H. Sequin and Michael F. Tompsett, "Charge Transfer Devices," *Advances in Electronics and Electron Physics*, Supplement 8, (Academic Press, New York San Francisco London 1975) pp. 126-129, incorporated herein by reference in its entirety. Because charge metering measures out charge in a serial manner, using charge metering to count photoelectrons from photon-counting detectors may reduce the readout speed.

FIGS. 3A-3D shows how a charge meter 300 separates a multiple-electron packet 320 into a single-electron packet 322 suitable for detection by a GM-AD. The charge meter 300 may be a CCD with electrodes 340a-340c (collectively, 340) that are about 0.15 $\mu m^2$ in area and separated from adjacent electrodes 340 by between about 0.1 $\mu m$ and about 0.3 $\mu m$. Selectively applying or varying potentials to the electrodes 340 sets or changes the potential profile in the charge meter 300, creating potential wells 330a and 330b whose position, width, and depth depend, in part, on the applied potential.

Figure 3A:
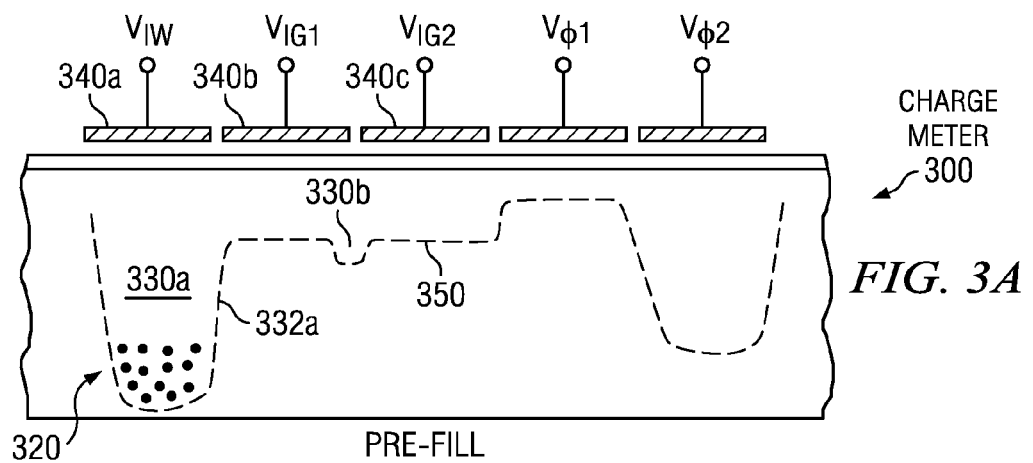
FIGS. 3A-3D are schematic diagrams that illustrate a fill-and-spill technique for isolating single electron packets in an electron counter.
Figure 3B:
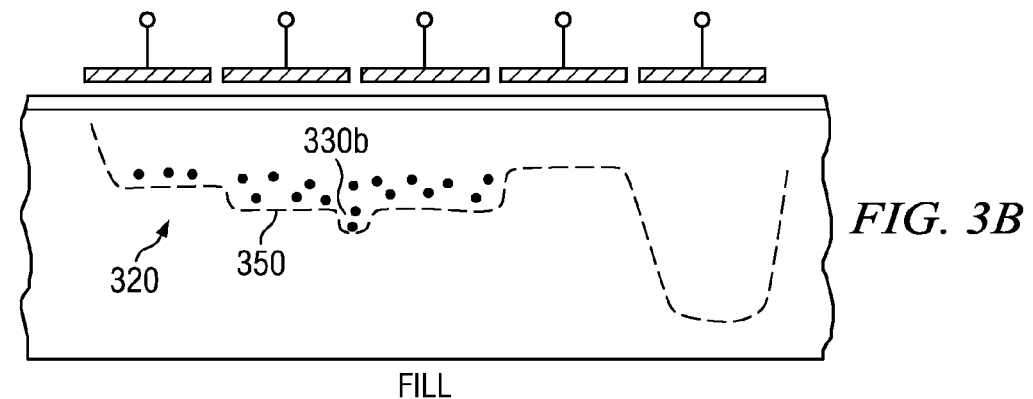

As shown in FIG. 3A, a high voltage $V_{IW}$ applied to the first electrode 340a creates a first potential well 330a with a variable potential barrier 332a that confines a multiple-electron charge packet 320. Shorting together the second and third CCD gate electrodes 340b and 340c before the spill forms a narrow, shallow well 330b in the middle of larger, even shallower well 350 under gates 340b and 340c. Lowering the input well potential, $V_{IW}$, as shown in FIG. 3B, causes the charge packet 320 to spill from the potential well 330a into the shallow region 350 under the second and third 340b and 340c gate electrodes, filling the narrow, shallow well 330b.

Figure 3C:
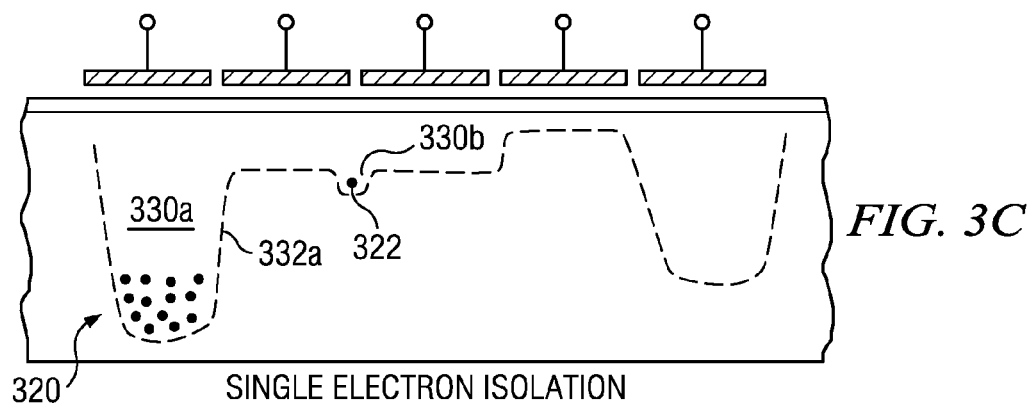
Figure 3D:
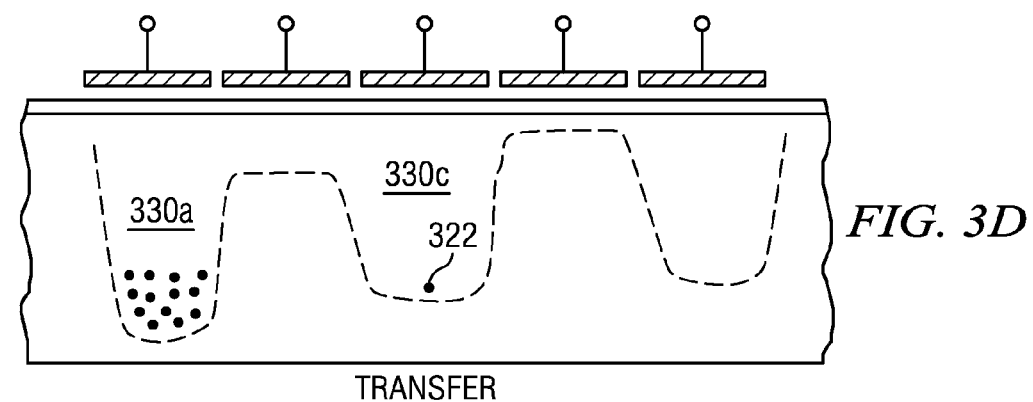

Increasing the input well voltage, $V_{IW}$, as shown in FIG. 3C, drains the charge from beneath the second and third gates 340b and 340c except for a single electron 322 left behind in the narrow, shallow well 330b. Once the single electron 322 is isolated, it is transferred to a GM-AD (not shown) by unshorting the second and third electrodes 340b and 340c, then increasing the potential applied to the third electrode 340c to form a potential well 330c. The single electron 322 spills from the shallow well 330b into the deeper potential well as the potential increases.

For this technique to work for single electrons the shallow well 330b should be deep enough to hold a single electron 322 long enough to prevent thermal emission of the electron from the well 330b. At room temperature the thermal energy associated with a single electron is approximately 26 meV, which suggests that the potential well 330b should be deeper than kT=26 meV (perhaps by a factor of two) otherwise thermal emission may cause the electron to escape the well 330b. If the well 330b is much deeper than 3 kT (about 78 meV at room temperature), the probability of emission due to thermal effects drops enough to allow the transfer operations shown in FIGS. 3A-3D to happen before thermal emission of the electron is likely to occur.

At the same time, the well 330b should be shallow enough to allow repulsive forces and thermal emission to prevent the well 330b from holding two or more electrons. In the ideal case, capture of a single electron by the well 330b creates a repulsive force that prevents the capture of other electrons. For this to occur, the capture of this electron must make the well shallower by at least kT, as seen by other electrons. Treating the well 330b and the gates 340b, 340c as parallel plates of a capacitor makes it possible to calculate the well area required to achieve the desired potential, kT. Capacitance is given by the following equation:

$$C = q/V \quad (1)$$

Substituting the charge of a single electron, $q=1.6\times10^{-19}$, and the desired potential, V=26 meV, yields a capacitance of C=6 aF. According to classical calculations, the area for a capacitance of 6 aF, assuming CCD pixel-like physical parameters, is approximately 0.15 $\mu m^2$. This dimension is within reach with present VLSI processing.

The depth and capacitance of the well 330b are also chosen to optimize the probability that a single electron (or no electron) remains in the well 330b after the spill long enough to be transferred out of the well 330b. If two electrons are in the well 330b and one is emitted, the well potential for the conditions given here changes by kT, making the emission rate much slower for the remaining electron. The emission rate, e, of the electron remaining in the well 330b is usually exponentially dependent on the well depth, $V_W$:

$$e(V_W) \propto \exp(-V_w/kT) \quad (2)$$

and the probability that an electron remains in the shallow well 330b after a time t usually can be written as:

$$p(t) \propto \exp[-e(V_W)t] \quad (3)$$

To ensure a high probability that only one electron remains in the tiny well 330b, the broad, shallower well 350 (i.e., the region under gates 340b and 340c in FIG. 3B) should be small enough to complete the spill in the time allotted for it. This means that the width of the broad well 350 should be smaller than $(Dt)^{1/2}$, where D is the electron diffusion constant in square centimeters per second and t is the allotted fill/spill time. The allotted time, t, should not be too long, or else the electron 322 trapped in the tiny well 330b may be thermally emitted. Generally, the emission time constant $\tau=1/e(V_W)$ should be longer than both the time required to perform both the fill/spill operation shown in FIGS. 3B and 3C and the transfer operation shown in FIG. 3D. Otherwise, there is a high probability that the electron will be emitted before it can be transferred to the GM-AD.

Other techniques for creating a single electron packet include placing a single atom trap under the first input gate 340a or lithographically defining an oxide step in the dielectric under the first input gate 340a, provided that the emission time constant of the electron in the resulting trap or pocket can be tuned appropriately. The time constant could be adjusted by creating a lateral electric field using gates adjacent to the first input gates 340a. A lateral electric field lowers the emission time constant through field-assisted emission of the electron trapped in the trap or pocket.

High-Voltage Source-Follower Buffer

Figure 4:
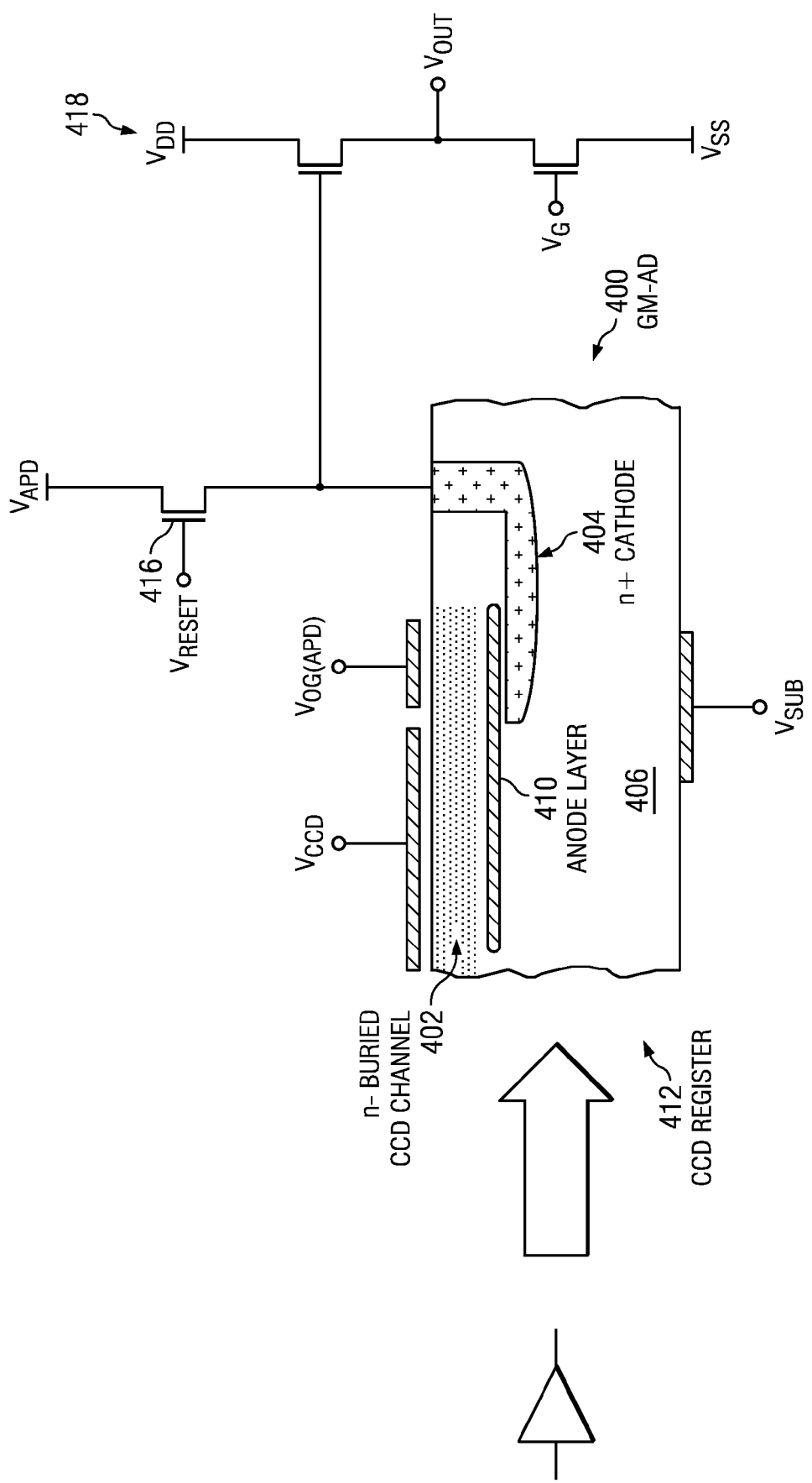
FIG. 4 is a schematic diagram of a digital electron counter that shows a cross-section of a CCD buried channel, lateral Geiger-mode avalanche diode (GM-AD), and high-voltage source-follower amplifier.

FIG. 4 is a schematic diagram of a floating diffusion amplifier integrated with a vertical GM-AD 400 and a CCD register 412. The CCD register 412 includes an n⁻ buried CCD channel 404 disposed above an anode layer 410 that extends over an n⁺ cathode 404, all of which are in a p⁺ substrate 406. A reset transistor 416 controls the application of a potential from a voltage supply $V_{APD}$ to the cathode 404. A source-follower amplifier 418 coupled to the cathode 404 provides an output in response to the arrival of an electron in a high-field region between the anode 402 and the cathode 404.

Figure 5A:
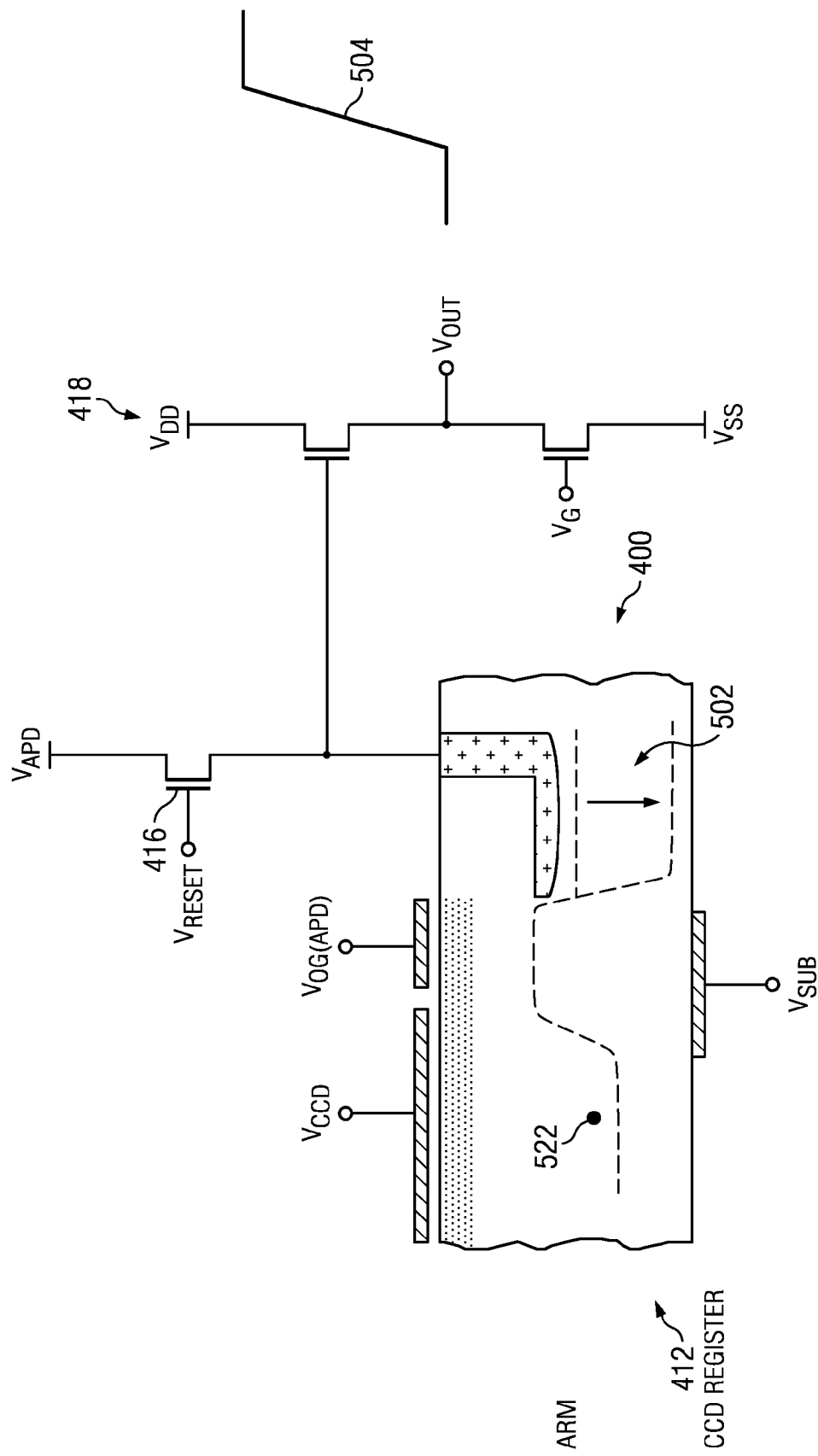
FIGS. 5A-5C are schematic diagrams that illustrate a high-voltage, source-follower amplifier operation performed using the electron counter shown in FIG. 3.
Figure 5B:
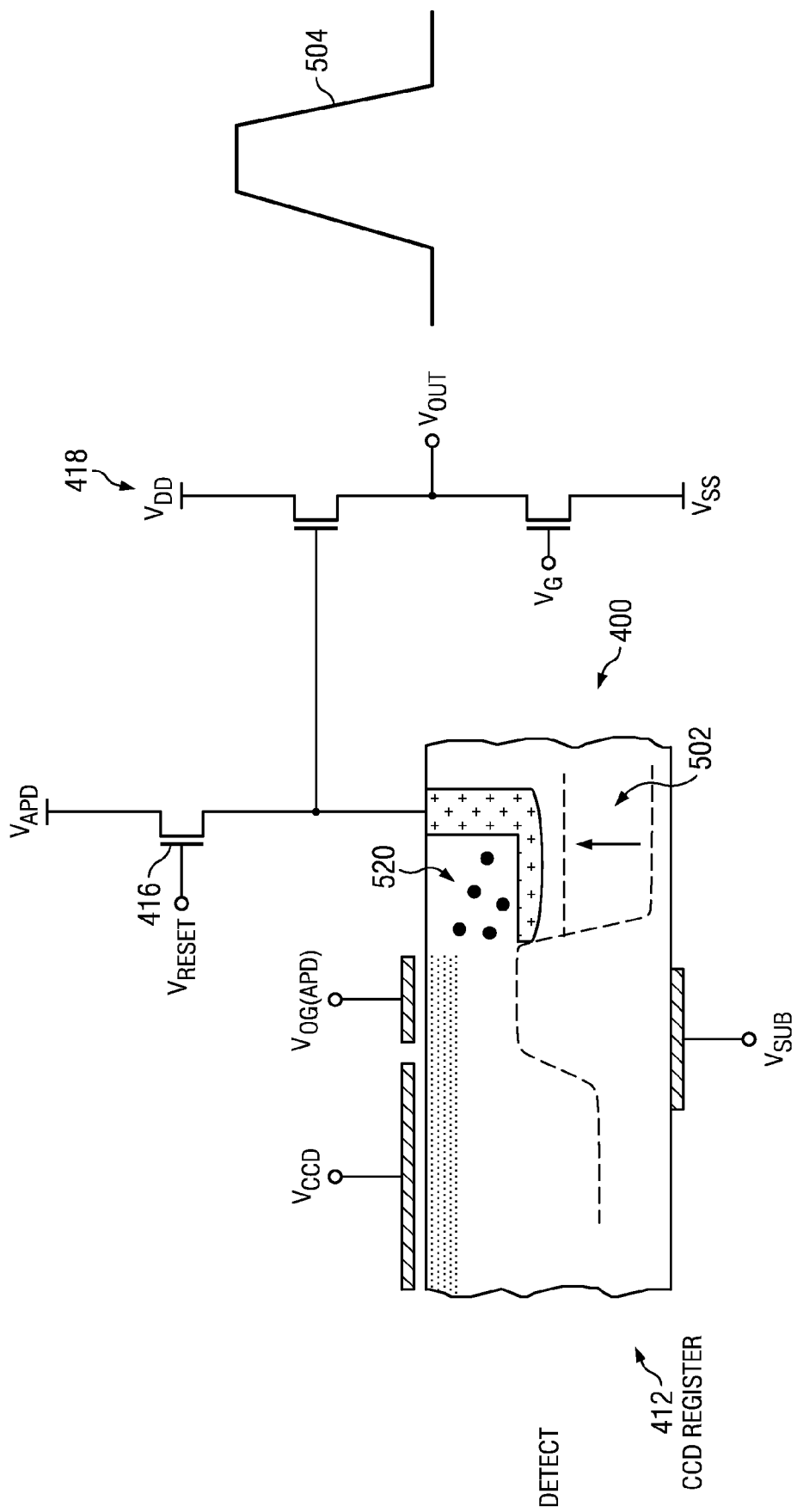
Figure 5C:
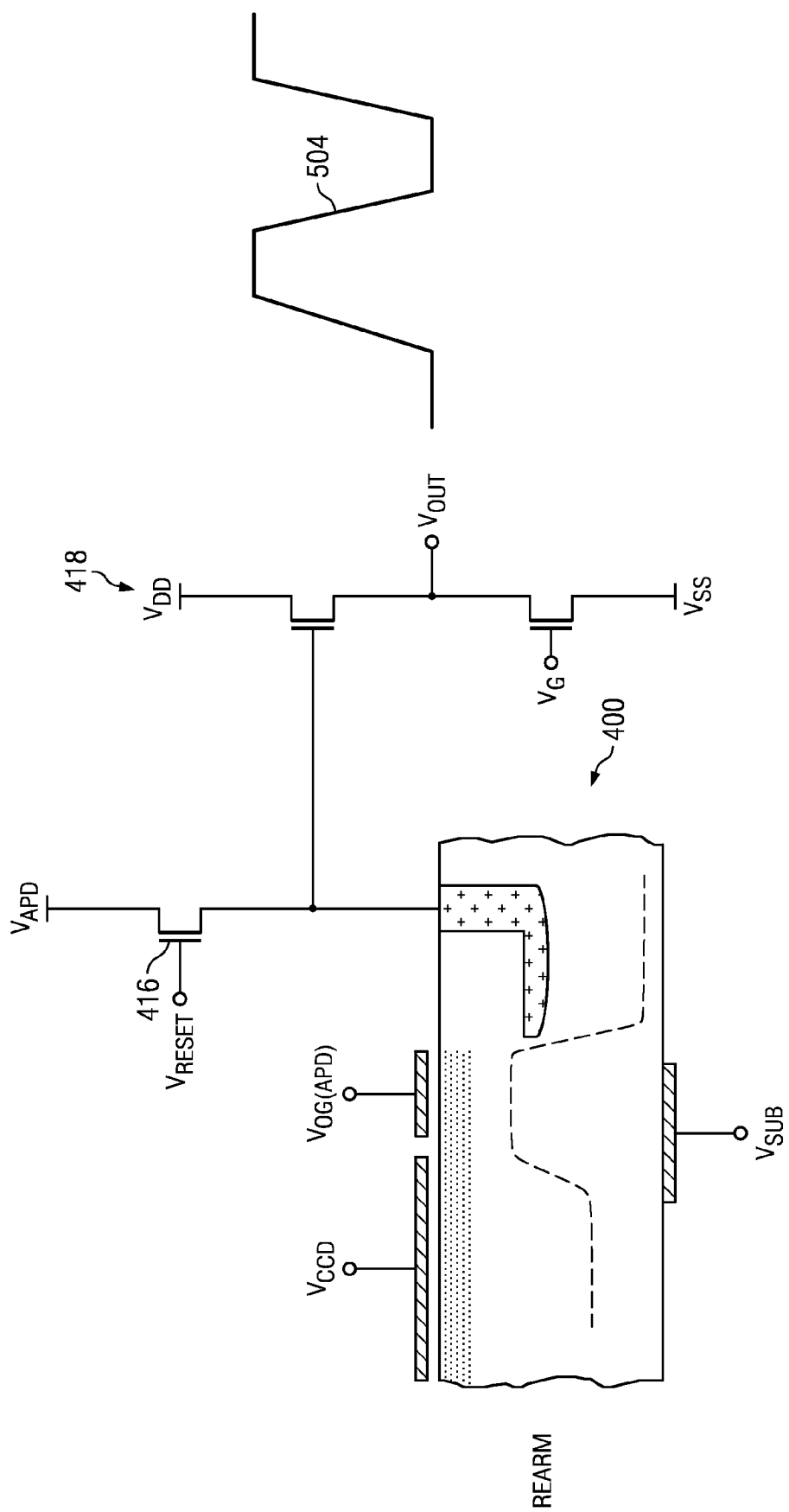

FIGS. 5A-5C show the detection process with the GM-AD 400 and source-follower amplifier 418 of FIG. 4. The detection process begins by setting the cathode 404 of the GM-AD 400 above breakdown using a reset transistor 416, as shown in FIG. 5A. This is illustrated in FIG. 5A by increasing the absolute value of a potential 502 at the cathode 404. Next, an electron 522 is transferred from the CCD register 412 to the GM-AD 400, initiating an avalanche as the electron 522 passes through a high field region between the CCD register 412 and GM-AD cathode 404. Electrons 520 generated by the avalanche accumulate on the cathode 404, as shown in FIG. 5B, decreasing the voltage of the cathode 404, which, in turn, causes the output 504 of the source follower 418 to transition from a high voltage to a low voltage.

The change in voltage 504 for a detected electron 522 depends on the capacitance and bias above breakdown of the cathode 404 and can be designed to be as much as a few volts. Typically, the change in voltage 504 is large enough and abrupt enough to act as a digital pulse suitable for driving logic gates or digital memory. After the signal 504 has been detected, the cathode 404 is reset using the reset transistor 416 so that the GM-AD 400 is ready to detect the next electron, as shown in FIG. 5C.

GM-AD Structure

One challenge in integrating a GM-AD structure into a CCD is to establish an electric field high enough to accelerate an electron out of the CCD buried channel without inducing tunneling currents or forming pockets that might trap charge. Generally, it is desirable to keep the voltages that bias the GM-AD as low as possible to prevent tunneling and for ease of integration with other on-chip circuit components as well as off-chip electronics.

In general, for a GM-AD structure to be suitable for electron counting, a high electric field should be established between the CCD buried channel well and the cathode of the GM-AD. The field should direct the electron from the buried channel to the highest field region of the GM-AD ensuring uniform avalanche events. Also, the GM-APD should be biased sufficiently above breakdown for a high probability of an electron initiating an avalanche event to be detected. Also, the voltage from the CCD buried channel to the cathode should increase monotonically towards the cathode to ensure that there are not any pockets that might trap electrons and later reemit electrons. Within the cathode to buried channel region, the electric field should always be kept below levels that would cause tunneling.

Figure 7:
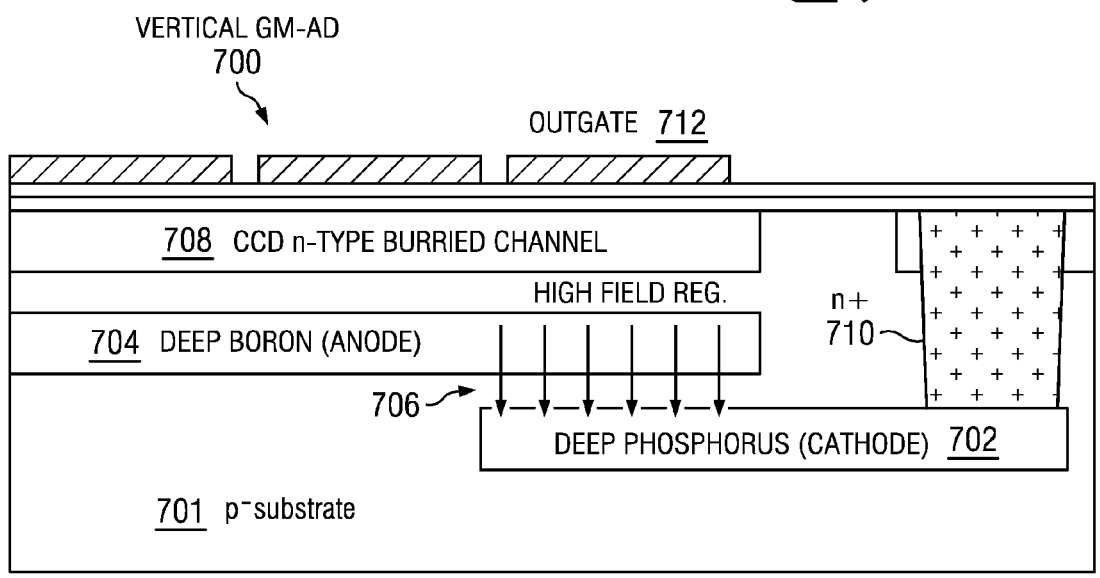
FIG. 7 is an elevation view of a digital electron counter that includes a vertically oriented GM-AD with a CCD.
Figure 6:
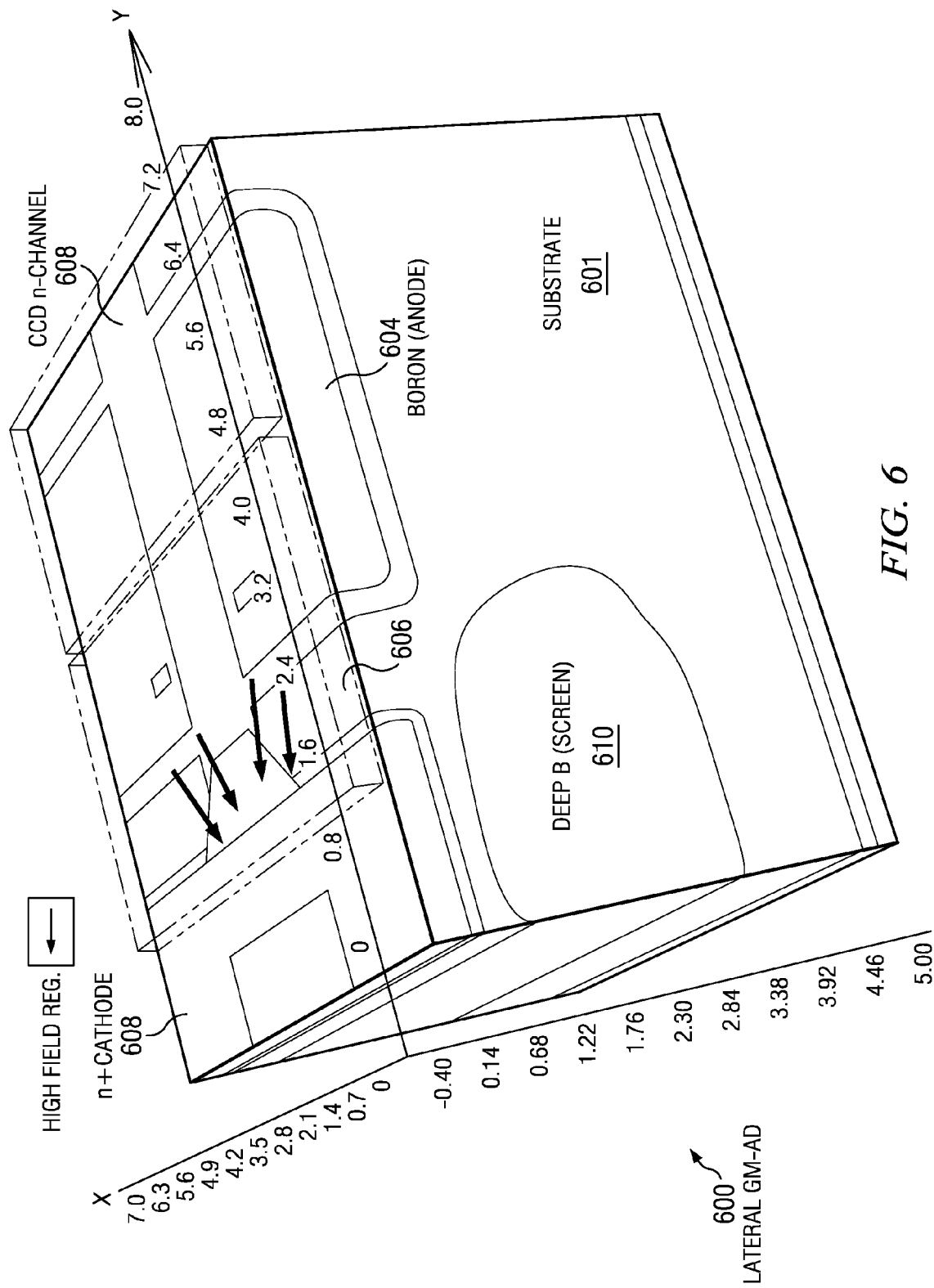
FIG. 6 is a perspective view of an electron counter that includes a laterally oriented GM-AD with a CCD.

FIGS. 6 and 7 show a lateral GM-AD structure 600 and a vertical GM-AD structure 700, respectively. Each structure 600 and 700 includes a cathode 602, 702 disposed adjacent to an anode 604, 704 to form a high-field region 606, 706 in a substrate 601, 701. Typical field strengths in the high-field regions range from about 200 kilovolts per centimeter to about 500 kilovolts per centimeter. In the lateral GM-AD 600, the cathode 602 and anode 604 are both at the surface of the substrate; in the vertical GM-AD 700, the cathode 702 is below the anode 704. In either case, the anode and cathode may be separated by about 0.5-1.0 µm, and the cathode is adjacent to a CCD n-type buried channel 608, 708. The lateral GM-AD 600 also includes a deep boron screen 610 to isolate the p-doped regions near the surface of the substrate 601. The vertical GM-AD 700 also includes an outgate 712 that controls the potential of the high-field region 706 and an $n^+$ contact 710 that allows electrical connection to a reverse bias supply (not shown).

Figure 8A:
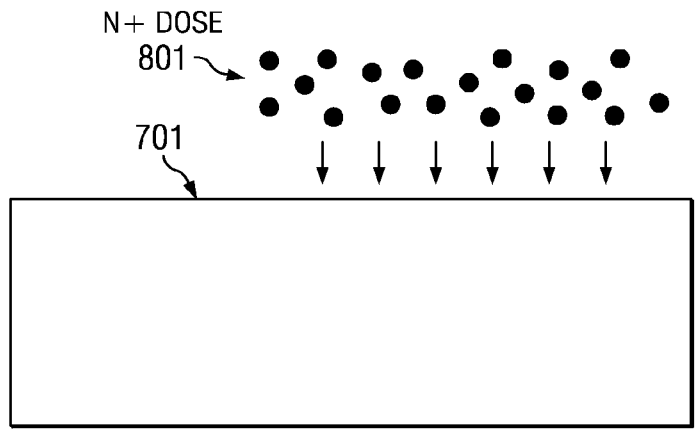
FIGS. 8A-8D illustrate fabrication of the vertical GM-AD of FIG. 7.

FIGS. 8A-8D illustrate fabrication of the vertical GM-AD 700 shown in FIG. 7. First, the cathode 702 is formed by delivering a dose 801 of $n^+$ dopants ions to the substrate 701, such as silicon, as shown in FIG. 8A. Typical doses 801 are from about $5 \times 10^{13}$ to about $10^{14}$ per square centimeter of phosphorus or arsenic ions. The dose 801 may be delivered to a depth of about 0.5 microns to about 2.5 microns below the surface of the substrate 701 using high-energy ion implantation with an implant energy of from about 1.0 Megavolts to about 2.2 Megavolts. Phosphorus ions can be implanted deeply within the substrate because they are relatively light; however, their light weight makes them more likely to migrate after implantation. Arsenic, on the other hand, is less prone to wandering, but may require higher implantation energies for the same implantation depth, leading to an increased chance of damage during implantation.

Figure 8B:
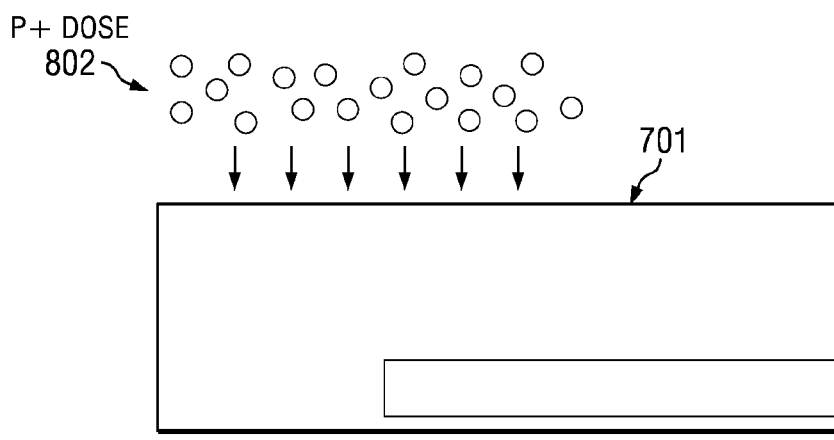
Figure 8C:
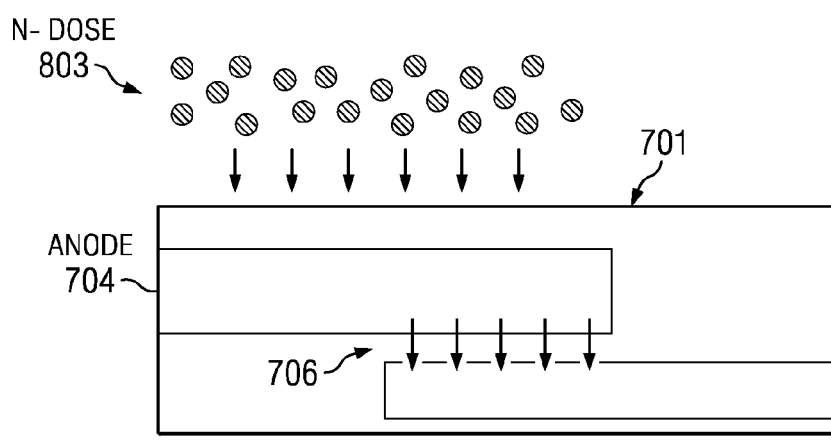
Figure 8D:
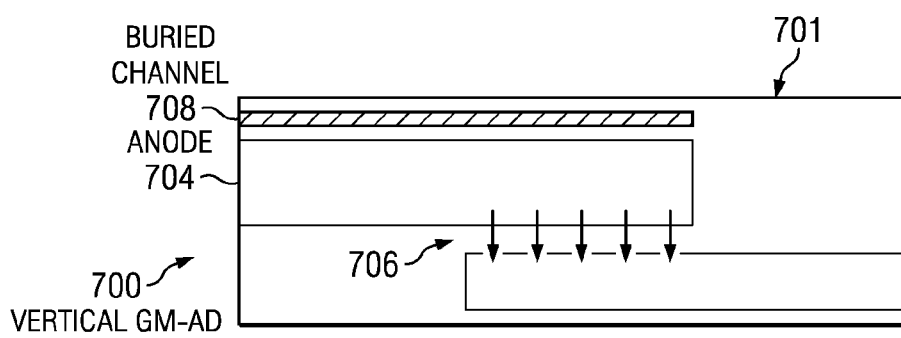

Next, the anode 704 is formed above the cathode 702 with a dose 802 of about $3 \times 10^{12}$ $p^+$ (e.g., boron) ions per square centimeter as shown in FIG. 8B. This dose results in doping density of about $10^{17}$ ions per cubic centimeter. The anode 704 may be formed about 0.5 microns to about 1.0 microns above the cathode 702 to create a high-field region 706 between the anode 704 and the cathode 702. The buried channel 708 of the CCD is formed over the cathode 702 by delivering a dose 803 of $n^-$ dopant ions to the substrate, as shown in FIG. 8C, to form the vertical GM-AD 700, as shown in FIG. 8D.

Alternatively, the cathode can be formed by delivering a dose to one side of the substrate, and the anode can be formed by delivering a dose to the opposite side, given proper selection of the substrate thickness. The cathode can also be formed at or near the surface of the substrate; the anode and CCD buried channel can be formed by depositing or growing material on the surface of the substrate, e.g., by epitaxial growth.

While this invention has been particularly shown and described with references to example embodiments thereof, it will be understood by those skilled in the art that various changes in form and details may be made therein without departing from the scope of the invention encompassed by the appended claims.

What is claimed is:

1. An electron counter, comprising:
    a charge-coupled device (CCD) register configured to transfer electrons;
    a Geiger-mode avalanche diode operably coupled to an output of the CCD register and configured to provide a digital output that indicates the presence or absence of an electron; and
    a charge-metering device operably coupled to the CCD register and the Geiger-mode avalanche diode, the charge-metering device configured to deliver electrons from the CCD register to the Geiger-mode avalanche diode.

2. An electron counter as in claim 1, wherein the charge-metering device includes a potential well.

3. An electron counter as in claim 1, further including:
    an nondestructive readout amplifier operably coupled to the output of the CCD register and configured to provide an analog signal indicative of the amount of charge present at the output of the CCD register.

4. An electron counter as in claim 1, further including:
    a detector array operably coupled to the CCD register and configured to convert incident photons into electrons.

5. An electron counter as in claim 1, further including:
    logic coupled to the Geiger-mode avalanche diode and configured to convert an output from the Geiger-mode avalanche diode into a logic-based signal.

6. An electron counter as in claim 1 in combination with an imaging system.

7. An electron counter as in claim 4, further including:
    at least one of a charge-splitting device and another charge-metering device operably coupled to a row or column in the detector array.

8. An electron counter as in claim 7,
    wherein the charge-metering device is operably coupled to the at least one of the charge-splitting device and the other charge-metering device and configured to deliver electrons to the Geiger-mode avalanche diode from the corresponding row or column in the detector array.

9. A method of counting electrons, comprising:
    delivering electrons from an output of a charge-coupled device (CCD) register to a Geiger-mode avalanche diode; and
    providing a digital output that indicates the presence or absence of an electron with the Geiger-mode avalanche diode,
    wherein delivering electrons includes metering electrons with a charge-metering device.

10. A method as in claim 9, wherein the metering electrons includes adjusting a potential barrier.

11. A method as in claim 9, further including:
    nondestructively amplifying electrons from the output of the CCD register to provide an analog signal indicative of the amount of charge present at the output of the CCD register.

12. A method as in claim 9, further including:
    converting photons into electrons with a detector array; and
    transferring the electrons from the detector array to the CCD register.

13. A method as in claim 9, further including:
    performing a logic operation on the digital output from the Geiger-mode avalanche diode.

14. A method as in claim 12, further including:
    imaging the photons onto the detector array.

15. A method as in claim 12, wherein transferring the electrons from the detector array includes metering or splitting packets of electrons.

* * * * *

UNITED STATES PATENT AND TRADEMARK OFFICE
CERTIFICATE OF CORRECTION

| | | |
|---|---|---|
| PATENT NO. | : 8,324,554 B2 | Page 1 of 1 |
| APPLICATION NO. | : 12/730037 | |
| DATED | : December 4, 2012 | |
| INVENTOR(S) | : David C. Shaver et al. | |

It is certified that error appears in the above-identified patent and that said Letters Patent is hereby corrected as shown below:

Col. 1, Line 8-10

The GOVERNMENT SUPPORT language should read:

This invention was made with government support under Contract No. FA8721-05-C-0002 awarded by the U.S. Air Force. The government has certain rights in the invention.

Signed and Sealed this
Twenty-sixth Day of February, 2013

Teresa Stanek Rea
*Acting Director of the United States Patent and Trademark Office*